United States Patent [19]
Feldman et al.

[11] Patent Number: 5,886,971
[45] Date of Patent: Mar. 23, 1999

[54] OPTICAL HEAD STRUCTURES INCLUDING SUPPORT SUBSTRATES ADJACENT TRANSPARENT SUBSTRATES AND RELATED METHODS

[75] Inventors: Michael R. Feldman; Alan D. Kathman, both of Charlotte, N.C.

[73] Assignee: Digital Optics Corporation, Charlotte, N.C.

[21] Appl. No.: 994,281

[22] Filed: Dec. 19, 1997

Related U.S. Application Data

[63] Continuation-in-part of Ser. No. 727,837, Sep. 27, 1996, Pat. No. 5,771,218.

[51] Int. Cl.$^6$ .................................................. G11B 07/00
[52] U.S. Cl. ...................... 369/112; 369/44.12; 369/122; 257/98
[58] Field of Search ................................ 369/112, 44.12, 369/122; 257/98

[56] References Cited

U.S. PATENT DOCUMENTS

| | | | |
|---|---|---|---|
| 4,626,103 | 12/1986 | Feldman et al. | 356/363 |
| 4,636,080 | 1/1987 | Feldman | 356/401 |
| 4,665,310 | 5/1987 | Heemskerk | 250/201 |
| 4,757,197 | 7/1988 | Lee | 250/239 |
| 4,866,694 | 9/1989 | Korth | 369/110 |
| 4,871,224 | 10/1989 | Karstensen et al. | 350/96.15 |
| 5,025,165 | 6/1991 | Chen et al. | 250/491.1 |
| 5,130,531 | 7/1992 | Ito et al. | 250/216 |
| 5,159,473 | 10/1992 | Feldman | 359/1 |
| 5,168,324 | 12/1992 | Hackel et al. | 356/346 |
| 5,170,269 | 12/1992 | Lin et al. | 359/9 |
| 5,189,485 | 2/1993 | Hackel et al. | 356/320 |
| 5,202,775 | 4/1993 | Feldman et al. | 359/11 |
| 5,204,516 | 4/1993 | Opheij | 250/201.5 |
| 5,229,883 | 7/1993 | Jackson et al. | 3569/569 |
| 5,237,434 | 8/1993 | Feldman et al. | 359/19 |
| 5,309,282 | 5/1994 | Feldman et al. | 359/641 |
| 5,337,398 | 8/1994 | Benzoni et al. | 385/90 |
| 5,422,870 | 6/1995 | Kojima et al. | 369/44.12 |
| 5,446,814 | 8/1995 | Kuo et al. | 385/31 |
| 5,499,312 | 3/1996 | Hahn et al. | 385/91 |
| 5,499,732 | 3/1996 | Nishimoto | 216/24 |
| 5,583,843 | 12/1996 | Horinouchi | 369/103 |
| 5,608,233 | 3/1997 | Sahara et al. | 257/80 |
| 5,621,715 | 4/1997 | Ohyama | 369/112 |
| 5,638,469 | 6/1997 | Feldman et al. | 385/14 |
| 5,771,218 | 6/1998 | Feldman et al. | 369/112 |

FOREIGN PATENT DOCUMENTS

| | | |
|---|---|---|
| 0 510 750 A1 | 10/1992 | European Pat. Off. . |
| 0 581 519 A2 | 2/1994 | European Pat. Off. . |
| 2725547 | 4/1996 | France . |
| 9-251663 | 9/1997 | Japan . |
| WO 93/11453 | 6/1993 | WIPO . |

OTHER PUBLICATIONS

Seimi Sasaki et al., *Marker Alignment Method For Passive Laser Coupling On Silicon Waferboard,* IEICE Trans. Commun., vol. E79–B, No. 7, Jul. 1996, pp. 939–942.

PCT International Search Report, PCT/US 97/17279, Mar. 20, 1998.

*Primary Examiner*—Tod R. Swann
*Assistant Examiner*—Kim-Kwok Chu
*Attorney, Agent, or Firm*—Myers Bigel Sibley & Sajovec

[57] ABSTRACT

An integrated optical head, such as, for a disk drive, preferably includes an optically transparent substrate. The substrate has a diffractive optical element formed on one face and a plurality of electrical contact pads exposed on the other face. A light source is positioned to emit light through the substrate, through the diffractive optical element, and toward data storage media. The light source includes a plurality of electrical contact pads corresponding to the plurality of electrical contact-pads exposed on the face of the substrate. An optical detector is positioned to detect light reflected from the data storage media, through the diffractive optical element, and through the substrate. The optical detector includes a plurality of exposed electrical contact pads corresponding to the plurality of electrical contact pads exposed on the face of the substrate. The substrate and the light source and optical detector are passively aligned using solder bumps between pairs of contact pads. A mechanical passive alignment arrangement is also disclosed.

61 Claims, 12 Drawing Sheets

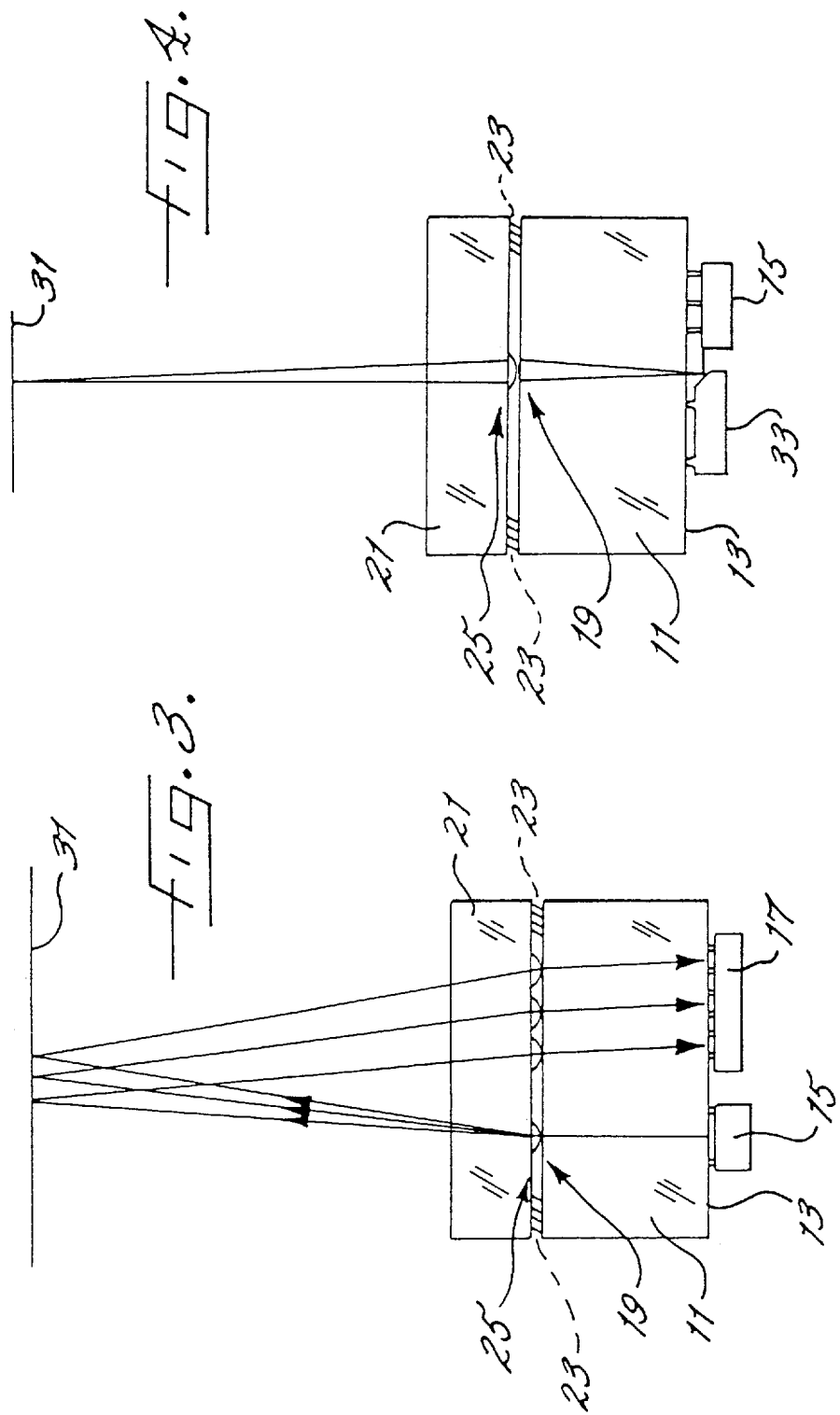

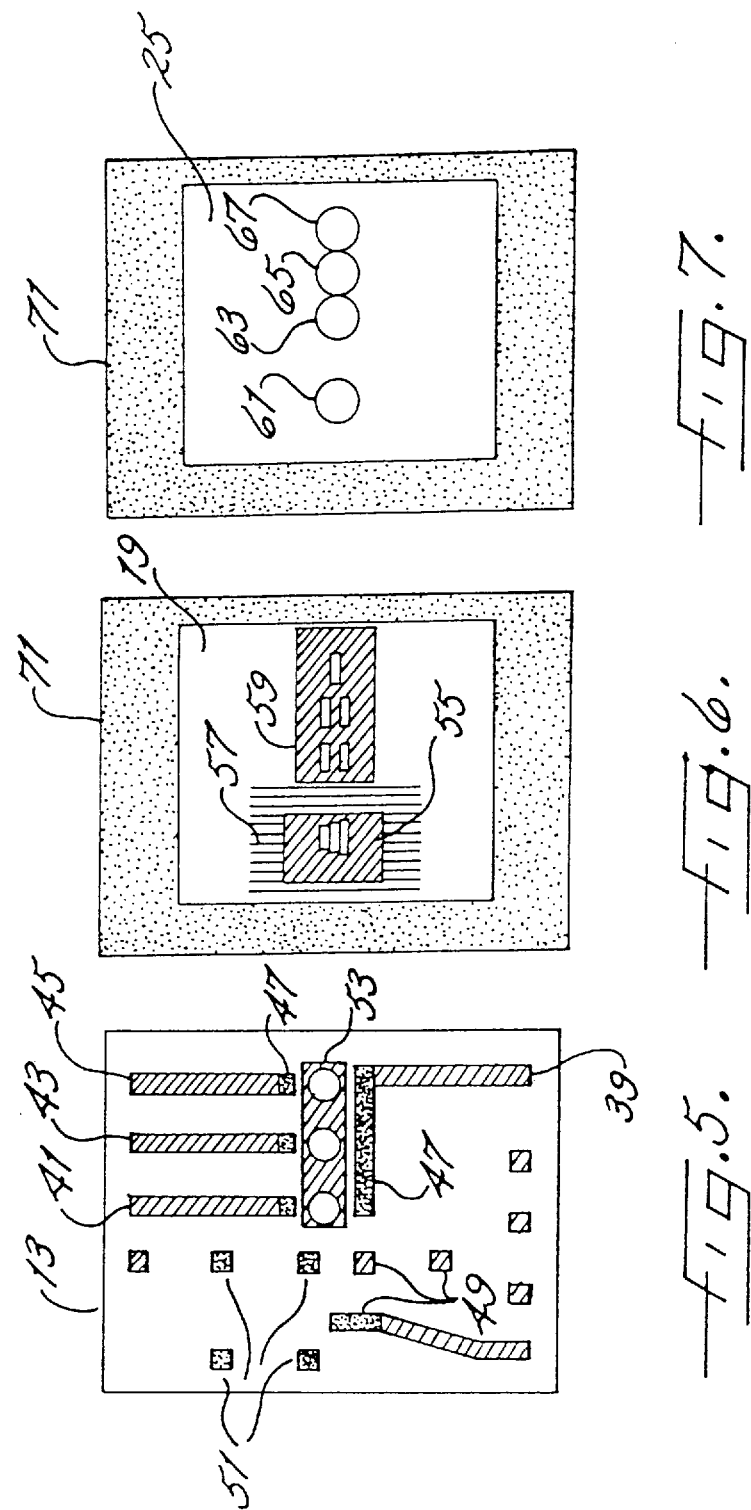

OPTICAL HEAD STRUCTURES INCLUDING SUPPORT SUBSTRATES ADJACENT TRANSPARENT SUBSTRATES AND RELATED METHODS

Related Applications

This application is a continuation-in-part application claiming priority based on U.S. patent application Ser. No. 08/727,837, filed Sep. 27, 1996, now U.S. Pat. No. 5,771, 218, issued on Jun. 23, 1998, and entitled "Passively Aligned Integrated Optical Head Including Light Source, Detector, and Optical Element and Methods of Forming Same" the disclosure of which is hereby incorporated herein in its entirety by reference.

FIELD OF THE INVENTION

The present invention relates to the field of optics and, more particularly, to an integrated optical head, such as for use in a disk drive.

BACKGROUND OF THE INVENTION

Many typical computer systems include a disk drive cooperating with storage media to permit storage and retrieval of data. A typical optical disk drive includes an optical head that conventionally uses a laser to transmit light to the optical disk. Light reflected from the surface of the disk is detected by an optical detector and processed to read data from the disk. An example of such an optical head is disclosed, for example, in U.S. Pat. No. 5,204,516 titled "Planar Optical Scanning Head Having Deficiency-Correcting Grating" by Opheij. The size of the various optical head components, however, are often too large for many desired applications and many market demands. Also, as densities of integrated circuits and system boards increase, the demand for smaller components increases. Additionally, the production process for a conventional optical head requires that the laser be excited or turned-on (i.e., "active alignment") for alignment of the laser, the detector, and the optical elements. An example of active alignment processes is illustrated and described in an article published in *Optical Engineering* (June 1989) titled "Holographic Optical Head For Compact Disk Applications" by Lee.

Unfortunately, these active alignment requirements are complex, time consuming, and relatively expensive. Further, the level of size reduction in the vertical direction of an optical head is limited. In addition, the relatively large size of the elements of an optical head which can be manipulated is determined by the need for active alignment.

SUMMARY OF THE INVENTION

With the foregoing background in mind, it is therefore an object of the present invention to provide an optical head, such as for a disk drive, and related methods which is more compact and less expensive to manufacture.

This and other objects, advantages, and features of the present invention are provided by an integrated optical head that relies on passive alignment of the various components. The integrated optical head preferably includes an optically transparent, substrate having first and second faces. The transparent subtrate may include a diffractive optical element formed on the second face of the transparent subtrate. An optical light source, such as a laser and an optical detector can be provided on a support substrate, such as a silicon substrate, and passive alignment means can be positioned between the first surface of the transparent substrate and the support substrate for passively aligning the two substrates. The light source and the optical detector can thus be aligned with respect to the transparent substrate. More particularly, the light source transmits light through the transparent substrate, through the diffractive optical element, and toward a target, such as optical storage media. The optical detector detects light reflected from the storage media, through the diffractive optical element, and through the transparent substrate.

Accordingly, the laser and detector may also be aligned with the optical elements on the second surface of the transparent subtrate.

An optical head according to the present invention may provide a size reduction of more than three times compared to the prior art, in part, based upon photolithographically shaped and placed refractive optical elements, as well as diffractive optical elements. Further, the laser and detector are preferably also accurately and passively aligned by means of photolithography. More particularly, in one embodiment, passive alignment is achieved by the wetted area and volume of solder in opposing alignment areas provided by contact pads.

In another embodiment, a second transparent substrate is aligned and joined to the first transparent substrate.

The second transparent substrate may carry one or more optical elements. According to this aspect of the invention, alignment areas in the form of benches or other mechanical features may be formed in one surface and mating recesses, for example, may be formed in the other surface. Adhesive attachment areas, which may overlap the alignment areas, hold the substrates together. Alignment may also be accomplished at the wafer level by having the elements of each die accurately placed using photolithography to accurately align the two wafers. The assembled dies can then be diced without the individual alignment means or steps being required for connecting the first and second transparent substrates.

Methods of forming an optical head are also provided according to the present invention. A method of forming an optical head preferably includes forming at least one optical element on a first face of a transparent substrate and positioning a laser adjacent the first face of the substrate so as to emit light through the substrate, through the at least one optical element, and toward the data storage media. An optical detector preferably is positioned adjacent the first face of the transparent substrate adjacent the laser to detect light reflected from the data storage media, through the substrate, and to the optical detector. The laser, the optical detector, and/or the at least one optical element on the substrate may passively aligned using either the contact pads and solder bumps, or the mechanical alignment as discussed above.

An integrated optical head and the related methods according to the present invention advantageously provide a significantly smaller optical head for fabrication without the need for exciting or turning on the laser light source to actively align the components. The integrated optical head according to the present invention overcomes the disadvantages of the prior art so that the wavelength of the laser is left as the predominant limiting factor in size reduction instead of other considerations.

BRIEF DESCRIPTION OF THE DRAWINGS

Some of the objects and advantages of the present invention having been stated, others will become apparent as the description proceeds when taken in conjunction with the accompanying drawings in which:

FIG. 3 is a side elevational view of an integrated optical head according to the present invention;

FIG. 4 is side elevational view of the integrated optical head as shown in FIG. 3 rotated ninety degrees.

FIG. 5 is a plan view of the component side of a first transparent substrate of an integrated optical head according to the present invention;

FIG. 6 is a plan view of a holographic optical element of a first transparent substrate of an integrated optical head according to the present invention;

FIG. 7 is a plan view of a refractive lens surface of a second transparent substrate of an integrated optical head according to the present invention;

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime and double prime notation are used to indicate similar elements in alternative embodiments.

Figure 1:
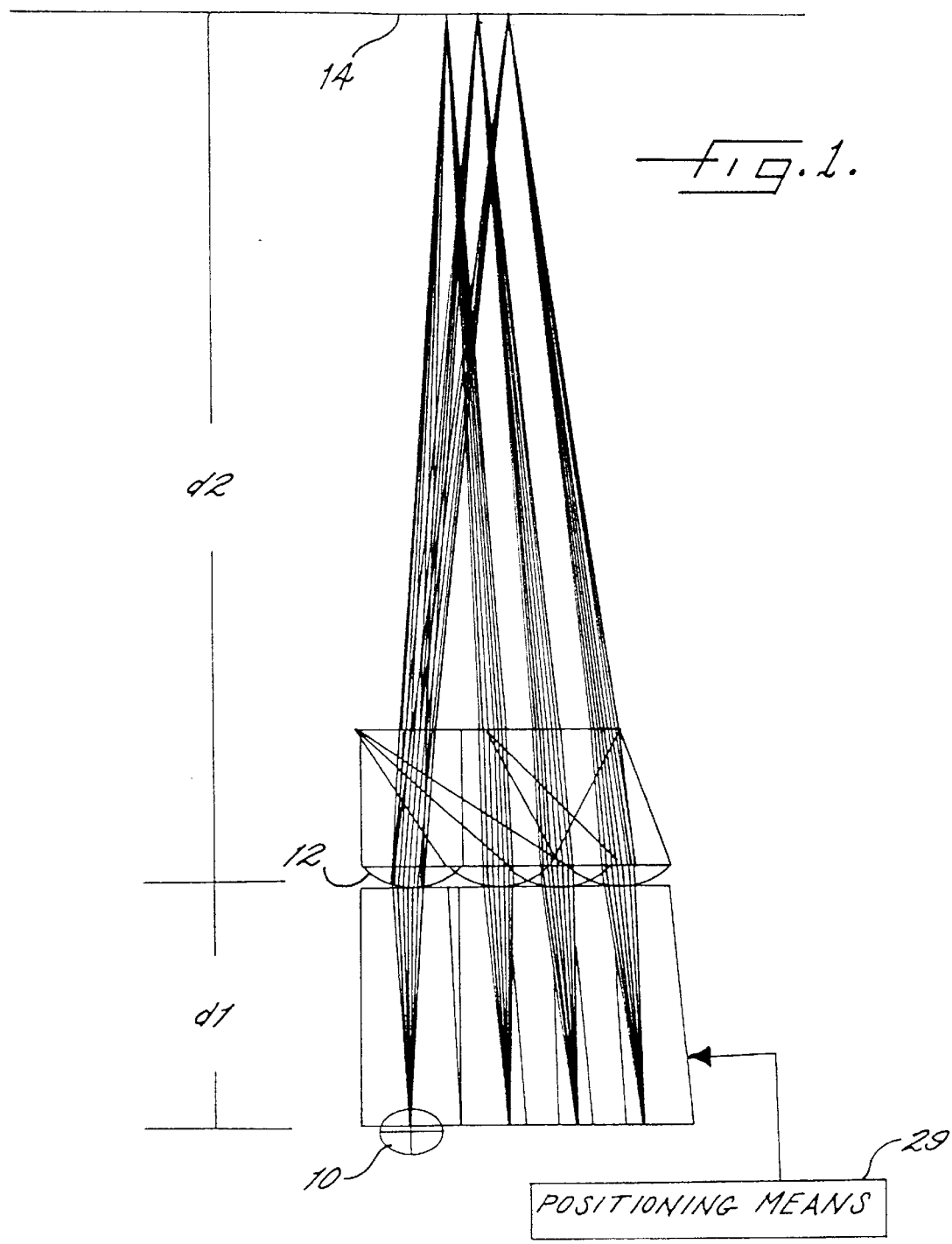
FIG. 1 is a schematic view of an integrated optical head according to the present invention.

FIG. 1 is an optical design schematic of an assembly according to the invention for use in detecting an optical track on a storage media. A light source 10 directs coherent light, with a dispersion angle of fifteen degrees, upward through an object distance d1 through a diffractive element (DOE) not shown and to a refractive lens 12. The DOE divides the light into a number of beams, only three of which are shown as a plurality of rays in FIG. 1. The beams are focused on surface 14 located at image distance d2 from the lens 12. The spot size and spacing of the light on the image surface 14 determines the tracking accuracy and therefore the amount of information that can be stored on the media. The size to which the spot can be reduced is in the instant design, approximately 0.020 mm. In the design of FIG. 1, the refractive lens 12 must have a significant curvature in order to focus the light to 0.020 mm spots on the media. The spots of light are spaced approximately 0.100 mm from each other on the media to limit crosstalk noise. As would be readily understood by those skilled in the art the optical head can be positioned by the illustrated positioning means 29.

If a design were attempted using a single lens as taught in the prior art, the lens curvature required to focus the laser light to 0.020 mm spots in this compact architecture would control the dimensions of the single lens. Thus the use of a single lens as taught in the prior art for reducing the size of optical heads, is a limiting factor in size reduction of the entire optical head assembly. This factor is one of the reasons that multiple lenses are employed in the instant invention instead of a single lens.

The distance d1 is used to advantage to provide an adequately wide beam at the DOE as shown later with respect to FIG. 7. The distance d2 is chosen to achieve adequate spot size modulation depth and depth of focus at the media surface.

The ratio of the distances d1/d2 determines the amount of demagnification of the image reflected from the media that occurs in a lens. In a single lens design, this demagnification affects not only spot size but spot spacing. A demagnification of ¼ gives a spot size of 0.005 mm which because of aberration is spread to an area 0.025 mm. If a single lens design had been used, the spacing of the spots would also have been demagnified to 0.025 mm and significant crosstalk noise would result. By using individual lenses, spaced approximately 0.200 mm, the detectors can be spaced at about 0.220 mm and thereby eliminate crosstalk noise using the 0.025 mm light spots.

Figure 2:
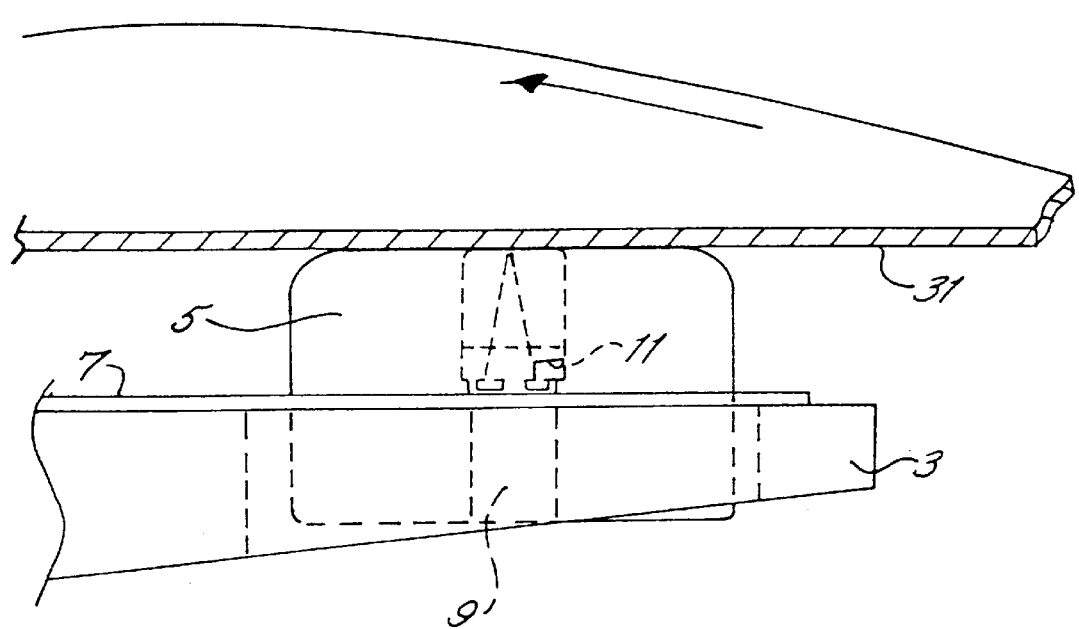
FIG. 2 is a fragmentary side perspective view of an integrated optical head according to the present invention.

FIG. 2 is a side view of a magnetic floppy disk head 5 with an optical tracking assembly according to a preferred embodiment of the invention. Head 5 is mounted, in arm 3 by known means not shown, for the extension across the various tracks of media 31. Head 5 is electrically connected to read and write circuits and tracing control circuits by a flexible printed circuit 7. A recess 9 of approximately two millimeters by one point six millimeters and four and a half or five millimeters deep is provided in head 5 in which the optical assembly comprising substrate 11 is mounted and connected to flexible printed circuit 7. It will be appreciated that the same assembly techniques and methods of the invention may be used to assemble optical disk read heads, as well as magnetic disk heads with optical tracking.

Referring now to FIG. 3, a first transparent substrate 11 comprising fused silica or other optical material has component mounting metalized pads or contact pads placed on its bottom surface 13, such as using substrate fiducial marks or indicia and accurately aligned photolithographic masks and metal deposition steps known in the art of microelectronic circuit manufacture. In this preferred embodiment, surface 13 of substrate 11 is approximately 1.6 mm by 2 mm and the substrate 11 is approximately 0.8 mm thick.

A laser chip 15 is mounted to the surface 13 by means of some of the mentioned metalized pads. As shown in FIG. 4, laser 15 is an edge emitting laser with the laser light directed upwards through means of a precision mirror 33 as shown in FIG. 4. It will by understood that the edge emitting laser 15 can be replaced with a vertical cavity surface emitting laser and thereby obviate the need for the precision mirror in order to direct the laser beam normal to the substrate surface.

An optical detector chip 17 is also mounted to the component surface of substrate 11 by means of the metalized pads. A hologram surface 19 on the opposite side of substrate 11 carries the diffractive optical elements shown in detail in FIG. 7. The diffractive optical element phase profiles are designed using the computer calculations and manufactured using techniques taught by Swanson et al. in U.S. Pat. No. 5,161,059, the entire disclosure of which is incorporated herein by reference.

Figure 11:
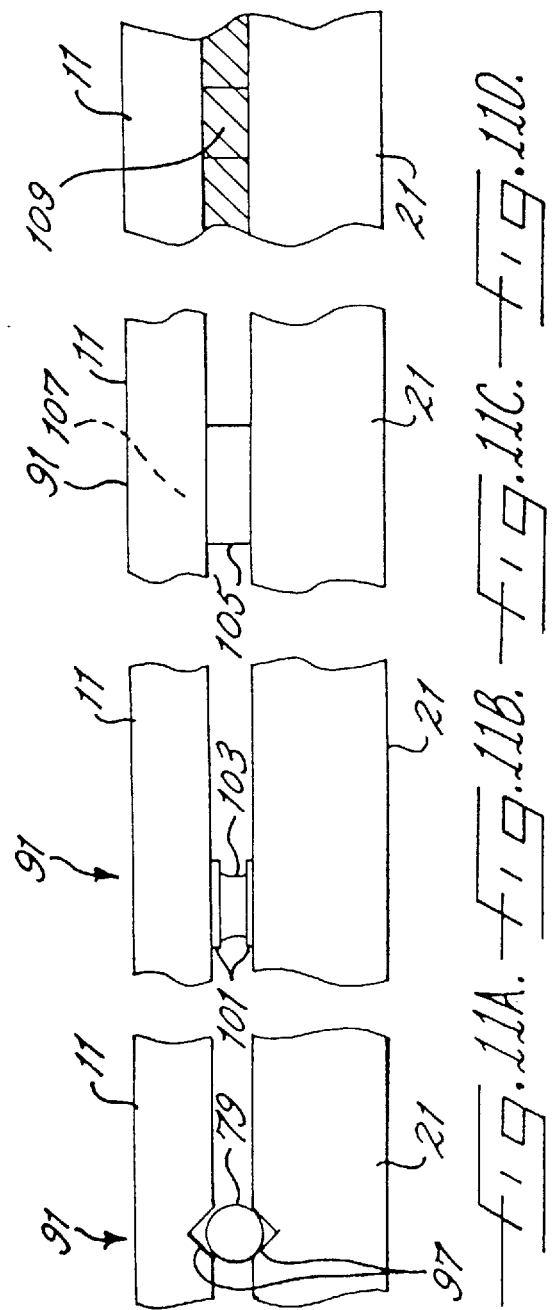
FIGS. 11A–11D are vertical fragmentary sectional views of example alignment features according to the present invention.

The optical elements are created photolithographically using the same fiducial marks or indicia used to place the metalized pads. Alternately second fiducial marks that have been aligned with the first marks may be used to align the masks that are also used to create the optical elements. In this way when the light source, mirror and detector are mounted on their metalized pads, the optical paths among the devices and through the optical elements are in optical alignment as shown more clearly in FIGS. 3 and 4. The precision mirror, if needed for redirecting light from an edge emitting laser, is considered to be a device for the purposes of this description only because of the way it is mounted using metalized pads and solder as a silicon chip would be mounted. The hologram surface 19 also has the attachment areas 23 that attach the first transparent substrate 11 with a second transparent substrate 21. These attachment areas and later described alignment areas are shown in detail in FIGS. 11 and 12.

The second substrate 21 carries the refractive optics in a surface 25 that provides the second lens of lens pairs or doublets. Light from laser 15 is shaped-and split by a diffractive optical element in hologram surface 19 into five separate beams of light that are directed through substrate and travel approximately 2.4 mm to the media. Only the chief ray of each beam is shown in FIG. 3 for clarity of the description. One beam is used for intensity feedback to control the electrical power to laser 15. The other four beams are used for media position or tracking detection. The beams of coherent light are reflected from media 31 and return through second substrate 21 and first substrate 11 to be detected by detector 17. Since the elements are all in their designed optical alignment by virtue of the placement of the metalization pads, there is no need to energize the laser and move the elements relative to each other to bring them into optical alignment. In other words, passive alignment is used rather than the active alignment requiring operation of the laser as in the prior art. It will be recognized that although the beams preferably pass first through the diffractive optical element in surface 19, the order of the optical elements in the light path could be changed or the elements could be combined into one more complex element without departing from the scope of the invention.

FIG. 4 is another side view of the assembly of FIG. 3. As shown in FIG. 4, the light emitted by edge emitting laser 25 comes out substantially parallel to the plane of component surface 13 and must be directed normal to the component surface by the 45 degree surface of mirror 33. The light can then pass through substrate 11, a diffractive optical element in surface 19, a refractive lens 61 in surface 25, substrate 21 and be reflected from media 31 as shown in FIGS. 1 and 3.

FIG. 5 is a plan top view of the component surface 13 looking down through transparent substrate 11. Electrical contact metalizations 39, 41, 43 and 45 provide electrical connections to detecting photo-diodes in detector 17. Centered under detector 17 is a metalized area 53 having three apertures through which light reflected from media 31 is received. Solder ball alignment areas 47 on each side of area 53 serve both as electrical contacts and as alignment mechanisms in this embodiment. The areas 49 are also solder ball pads and serve to align and connect the laser 35 to the first substrate and provide current to laser 15. Areas 51 on the other hand only provide mechanical alignment and mechanical attachment of mirror 33 to first transparent substrate 11.

The hologram surface 19 appears in FIG. 6 in plan view, again looking down onto substrate 11. Hologram surface 19 has metalized area 55 which acts as a mask to reduce stray light but allow three beams created by diffractive optics from the light from laser 15 to be directed to media 31 from which they are reflected to reach detector 17 through the five apertures shown in metallized areas 59. Surrounding metalized area 55 is a diffraction grating 57 that scatters stray light from laser 15 so that it does not adversely affect detector 17.

FIG. 7 shows the refractive lens surface 25, again in plan view looking down, this time through substrate 21. Lens 61 in combination with the diffractive optical elements in mask 55 shape and focus the laser light into three spots of approximately 20 μm diameter and spaced at approximately 100 μm onto media 31. Lenses 63 and 65 focus the light reflected from media 31 through mask 59 to detector 17 for position control and/or reading. Lens 67 focuses reflected light to the photo-diode of detector 17 that provides an intensity level signal to the power control circuits which control the electrical power provided to laser Surrounding both surface 19 and surface 25 is an attachment area shown generally as area 71 in FIGS. 6 and 7. Area 71 contains spacing stand off benches and is the area in which an adhesive is placed in order to join substrate 21. The standoff benches passively define a proper or desired vertical spacing or alignment. Preferably the adhesive is ultraviolet light cured adhesive that can be laid down without concern for time to harden. The adhesive is placed in areas 71 and then after the substrates 11 and 21 are aligned, the assembly is flooded with ultra-violet light to catalyze the adhesive.

In an alternate embodiment, the adhesive is replaced with photolithographically placed metalization pads and the two substrates are joined using solder ball technology.

Figure 8:
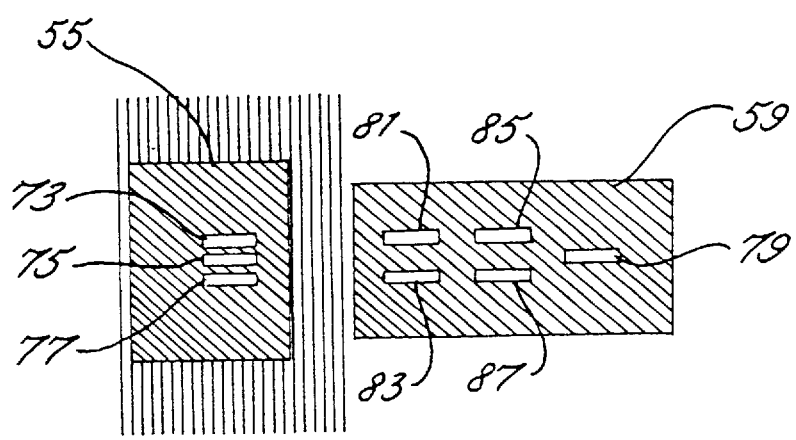
FIG. 8 is a plan view of diffractive optical elements of an integrated optical head according to the present invention.

FIG. 8 shows three diffractive optical elements 73, 75 with mask 55. These three elements provide the five beams of light to be reflected from the media, the three main rays of which are shown in FIG. 3. Element 75 provides the power control beam that is reflected from the media and is received at aperture 79 in mask 59 as shown in FIG. 8. Elements 73 and 77 each provide two beams that interfere at the media surface to create a dark band with two light bands on either side of the dark bands. The light bands are reflected back down to the pairs of apertures 81, 83 and 85, 87 shown in FIG. 8 to provide the varying light intensity that is used to detect an optical track on the media. The apertures 73, 75 and 77 containing diffractive elements are each approximately 100 μm long and 20 μm wide.

Figure 9:
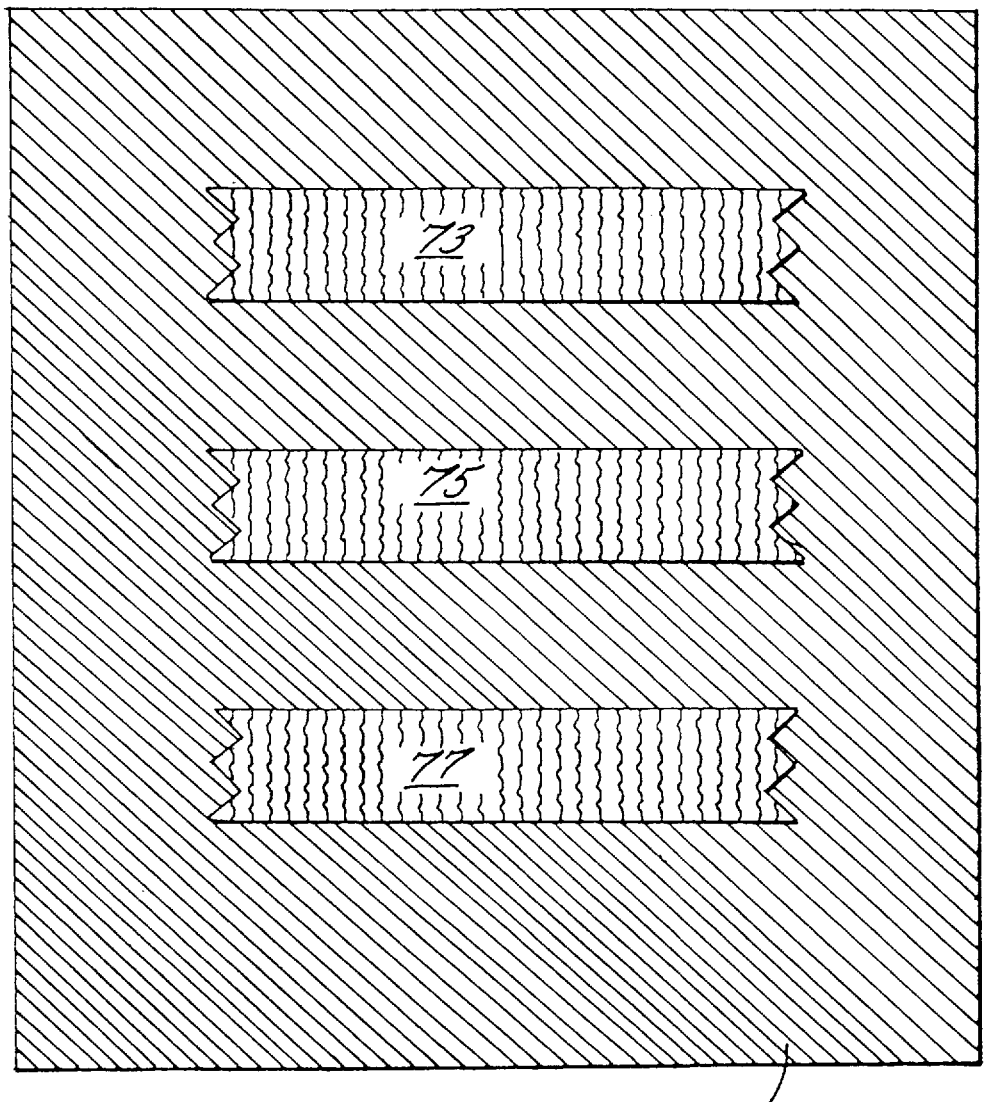
FIG. 9 is an enlarged view of mask portions of FIG. 4 according to the present invention.

Referring now to FIG. 9, the apertures of FIG. 8 are shown enlarged. The ends of each aperture 73, 75 and 77 are provided with an irregular boundary that change the orientation of the interference fringes so that they are not parallel with the optical track being detected and accuracy is improved.

Figure 10:
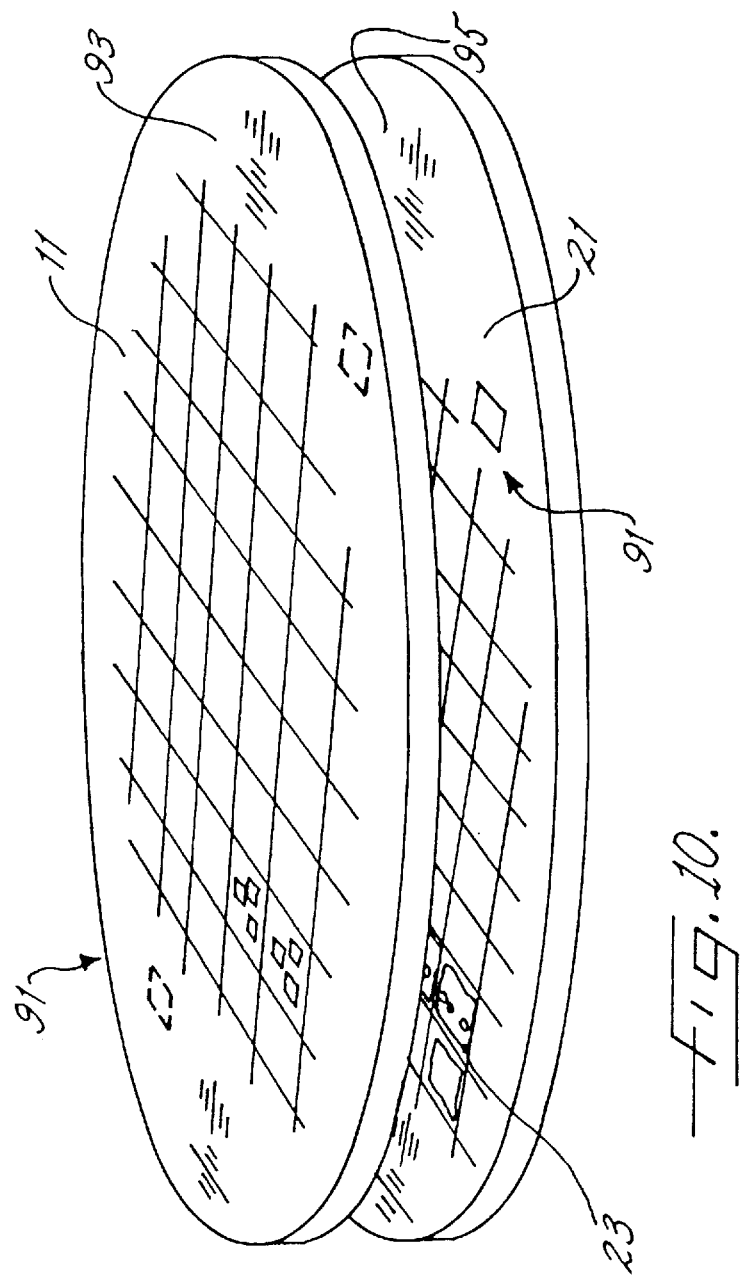
FIG. 10 is a perspective view showing an article including two wafers according to the present invention.

FIG. 10 shows the two substrates 11 and 21 prior to their being assembled into optical assemblies and diced. Because each element has been accurately placed on each substrate using photolithography, the entire wafers can be aligned and joined prior to being diced into chips without the need to energize any of the laser devices on the substrate 11. FIG. 10 shows the substrates inverted from the way they are shown in FIGS. 2, 3 and 4 in order to show the lasers, mirrors and detectors in place on top of each die.

Prior to putting the wafers together, the adhesive material 23 is placed in the area 71 of each die on at least one of the wafers. After the adhesive is placed, the two wafers are placed one above the other and aligned. In one embodiment of the invention, a known photolithographic mask aligning tool is used with vernier fiduciary marks 93 and 95 to monitor the relative displacement of the two substrates until they are in alignment with each other. The substrate 11 can then be lowered onto substrate 21, the alignment rechecked, and the adhesive catalyzed by ultraviolet light.

In another embodiment, the two wafers are passively aligned using the alignment means 91. Three forms of alignment means are contemplated and shown in FIGS. 11A, 11B and 11C. One, shown in FIG. 11A, takes the form of V-shaped grooves 97 etched into matching faces of the substrates 11 and 21. These grooves are then aligned with sphere 99 to index the two wafers into alignment. Note that only a few grooves and spheres are needed to align all of the dies while they are still together as a wafer. Another embodiment of the alignment means, shown in FIG. 11B, comprises photolithographically placed metalization pads 101 which are then connected by reflowing a solder ball 103. In a still further embodiment of FIG. 11C, a bench 105 is raised by etching the surrounding surface and the bench 105 is indexed into a recess 107, also created by photolithographically placed etchant, preferably reactive ion etchant.

In the adhesive area 71 of each die, means may be needed to accurately space the two substrates from each other. Spacing is accomplished in one embodiment by means of a bench 109 shown in FIG. 11D. Three or more benches 109 are located in the area 71 around each die in an adhesive with high compressive. In another embodiment, the solder bumps or balls and metalizations are used in area 23 accomplishing both attachment and alignment as shown in FIG. 11B. Alternately, when an adhesive with high compressive strength is chosen, only three or more such benches are needed for spacing the entire wafers and after the adhesive has set, the joined wafers can be diced without substrate spacing.

Figure 12:
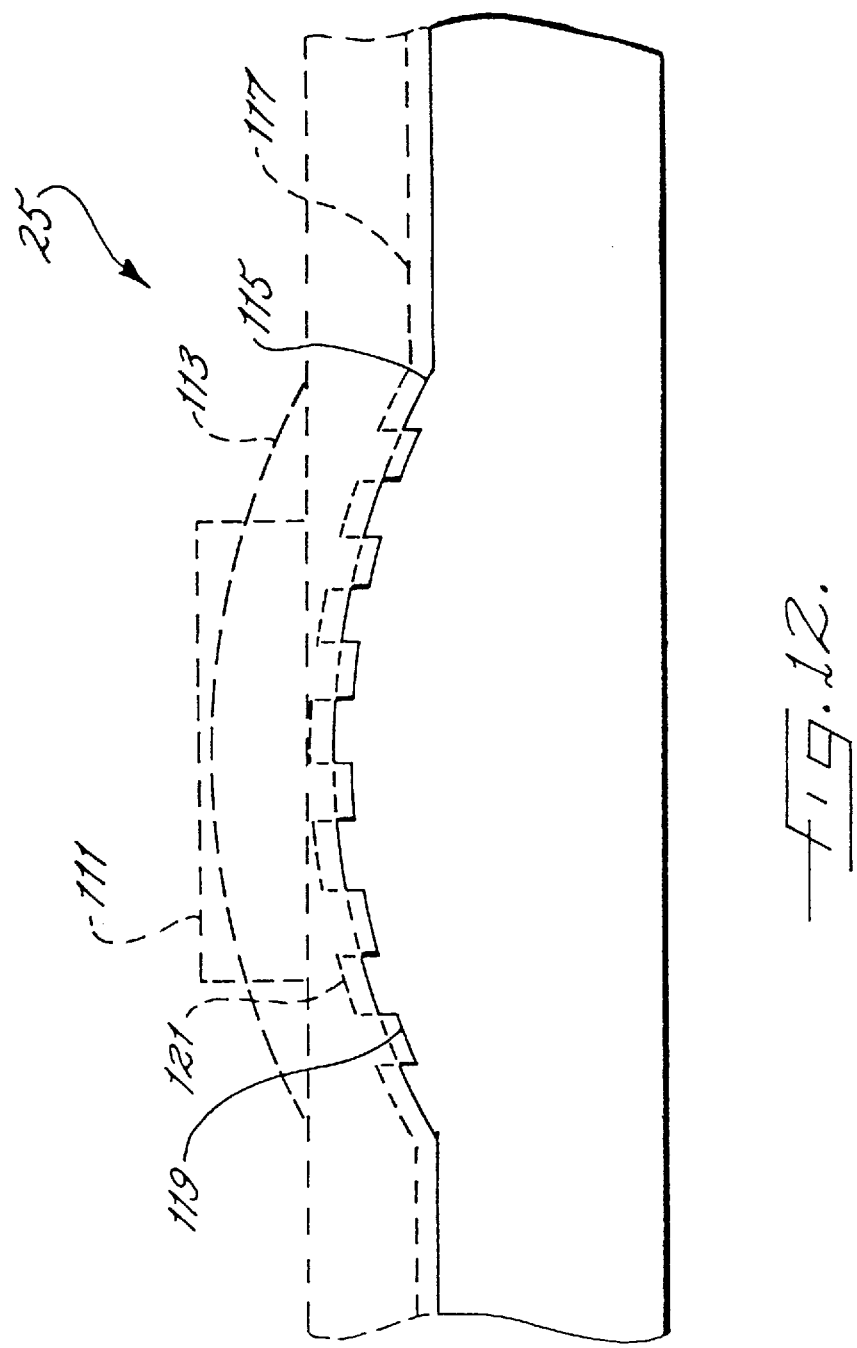
FIG. 12 is a vertical sectional view of a substrate showing a method of creating a hybrid microlens for an integrated optical head according to the invention.

Referring now to FIG. 12, a method of photolithographically placing an optical element on a substrate surface 25 in alignment with diffractive elements and/or electrical devices is shown. A refractive optical element in the form of a microlens 115 is formed by placing a circular layer of photoresist 111 on a surface of optical material using a mask. The photoresist is then partially flowed using controlled heat so that the photoresist assumes a partially spherical shape 113. Thereafter, the surface is etched and a refractive element 115 having substantially the same shape as the photoresist 113 is formed by the variable etch rate of the continuously varying thickness of the photoresist 113. In the event that a hybrid optical element is desired, the microlens 115 is further processed by etching or embossing steps. In one embodiment, a layer of photoresist 117 is placed over the microlens 115 and exposed through a photolithographic mask with the phase pattern of a diffractive optical element. When the exposed photoresist is then developed, the surface of the microlens can be further etched with the diffractive optical element pattern to produce a hybrid optical element 119. In another embodiment, a polymer is placed over the microlens in place of the photoresist and the phase pattern is embossed into the polymer as shown at 121. It also will be understood that although a convex element has been shown, the same technique can be used to create a concave microlens.

Having described the invention in terms of preferred embodiments thereof, it will be recognized by those skilled in the art of optical system design that various further changes in the structure and detail of the implementations described can be made without departing from the spirit and scope of the invention. By way of example, the diffractive optical elements may be placed on the same surface of a substrate on which the electronic components are accurately placed with these diffractive optical elements using photolithography. Likewise refractive optical elements may be placed using photolithography in alignment on the other surface of the same substrate thereby allowing an entire optical assembly to be fabricated using but one substrate without the need for actively energizing a light source in the assembly to accomplish alignment.

Figure 13:
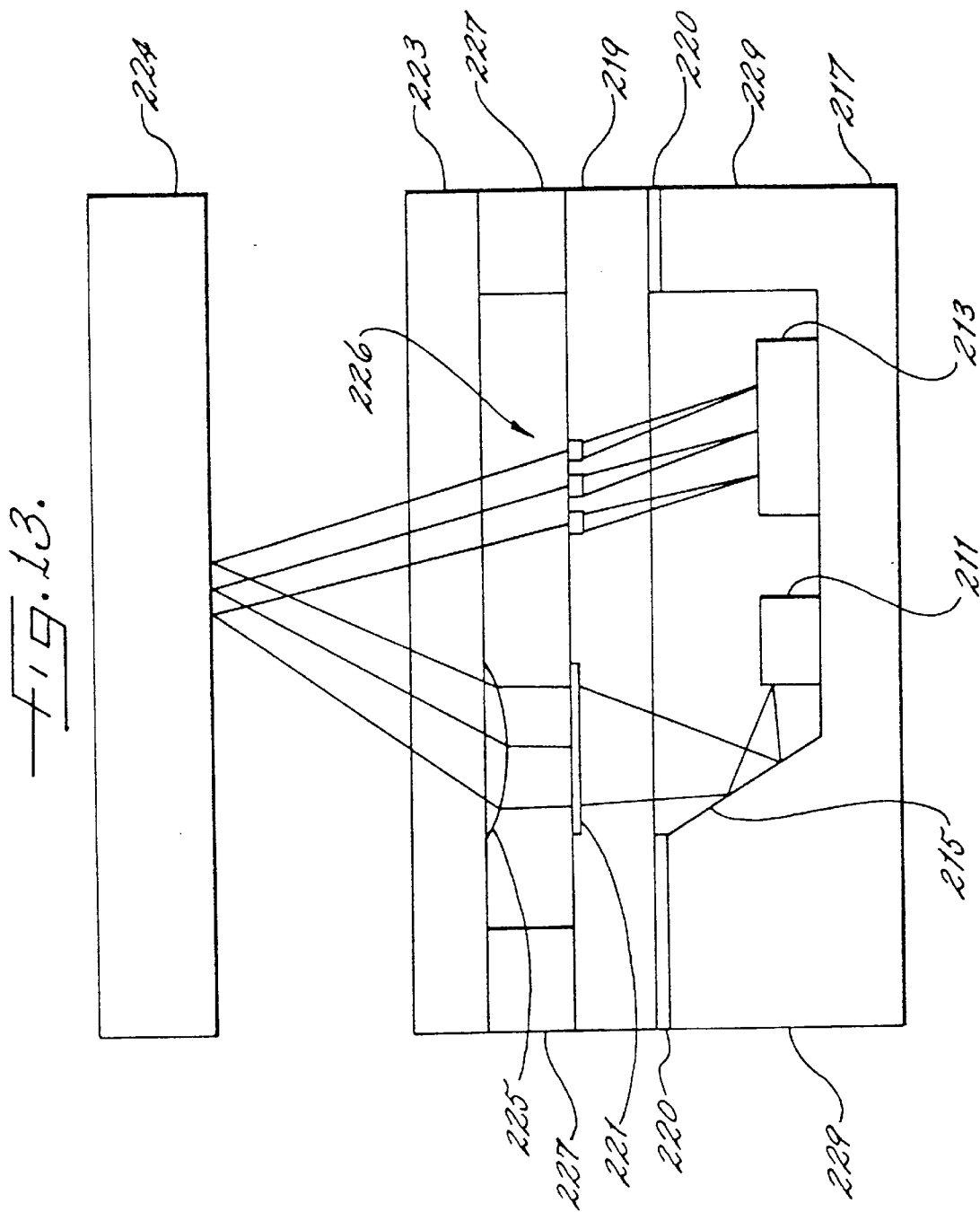
FIG. 13 is a cross sectional view of a first integrated optical head including a transparent substrate, and a light source and an optical detector on a support substrate adjacent the transparent substrate according to the present invention.

FIG. 13 is a cross sectional view illustrating an integrated optical head wherein the laser chip 211, the optical detector chip 213, and the precision mirror 215 are mounted on a silicon substrate 217. In addition, a first transparent substrate 219 including a diffractive optical element 221 is mounted on the silicon substrate 217, and a second transparent substrate 223 including a refractive optical element 225 is mounted on the first transparent substrate 219. Moreover, each of the substrates 217, 219, and 223 are aligned and secured so that light generated by the laser chip 211 is reflected by the precision mirror 215 through the first transparent substrate 219 and the diffractive optical element 221, and through the second transparent substrate 223 and the refractive optical element 225 to the media 224. The light is then reflected back through the second transparent substrate 223 and the first transparent substrate 219 to the optical detector chip. This structure can also include separate diffractive elements 226 on substrate 219. Similar diffractive elements 326 and 425 are respectively shown in FIGS. 14 and 15.

More particularly, the diffractive optical element 221 splits the light from the laser into three separate beams, and the refractive optical element 225 focuses each of these three beams onto respective portions of the media 224. The three beams are each reflected back through the first and second transparent substrates 223 and 219 to three respective portions of the optical detector chip 213. The transparent substrates 219 and 223 can be attached and aligned using attachment areas 227 as discussed above, for example, with reference to FIGS. 3, 4, 10, 11, and 12. Similarly, the silicon substrate 217 can be attached to the transparent substrate 219 using the attachment areas 229. Accordingly, the laser 211, mirror 215, and optical detector 213 on the silicon substrate 217 can be passively aligned with the diffractive optical element 221 on the transparent substrate 219 and with the refractive optical element 225 on the transparent substrate 223.

The attachment areas 229 can be provided by etching a recess into the silicon substrate 217 in which the laser, mirror, and detector are provided. In other words, the unetched portions of the substrate act as spacers. In addition, the substrates 217 and 219 can be bonded using solder material 220. Furthermore, the mirror 215 can be provided by an angled sidewall of the substrate adjacent the recess therein. Alternately, the attachment areas 229 can include spacers to provide space between the substrates 217 and 219 wherein the spacers are separate from the substrate 217. The mirror 215 can be a separate element attached to the substrate 217, or the mirror 215 can serve as a spacer.

Figure 14:
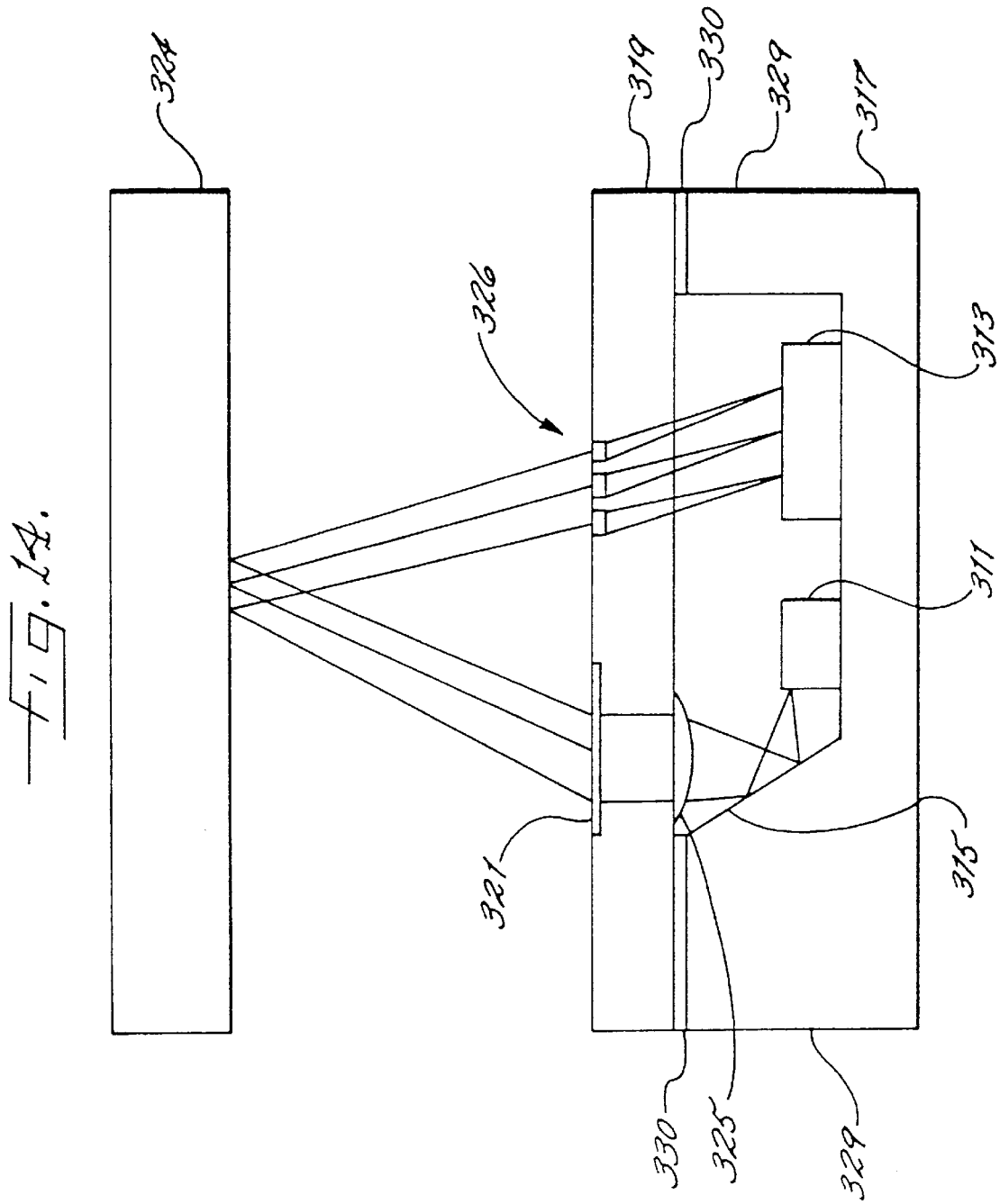
FIG. 14 is a cross sectional view of a second integrated optical head including a transparent substrate, and a light source and an optical detector on a support substrate adjacent the transparent substrate according to the present invention.

In FIG. 14, the refractive optical element 325 and the diffractive optical element 321 are provided on opposite sides of a single transparent substrate 319. As before, the laser chip 311, the mirror 315, and the optical detector chip 313 are provided on a silicon substrate 317 which is attached to the transparent substrate 319 using attachment areas 329 and solder material 330 as discussed above. Accordingly, the two substrates can be passively aligned so that light generated by the laser chip 311 is reflected by the mirror 315 through the refractive optical element 325 and the diffractive optical element 321 to the surface of the media 324. The light is reflected from the media 324 through the transparent substrate 319 to the optical detector chip 313. The refractive optical element 325 focuses the reflected light, and the diffractive optical element 321 separates the focused light into three beams which are directed to the media 325 and reflected to three separate detecting regions of the optical detector chip 313. The silicon substrate and the transparent substrate can be aligned and attached as discussed above with regard to FIG. 13.

Figure 15:
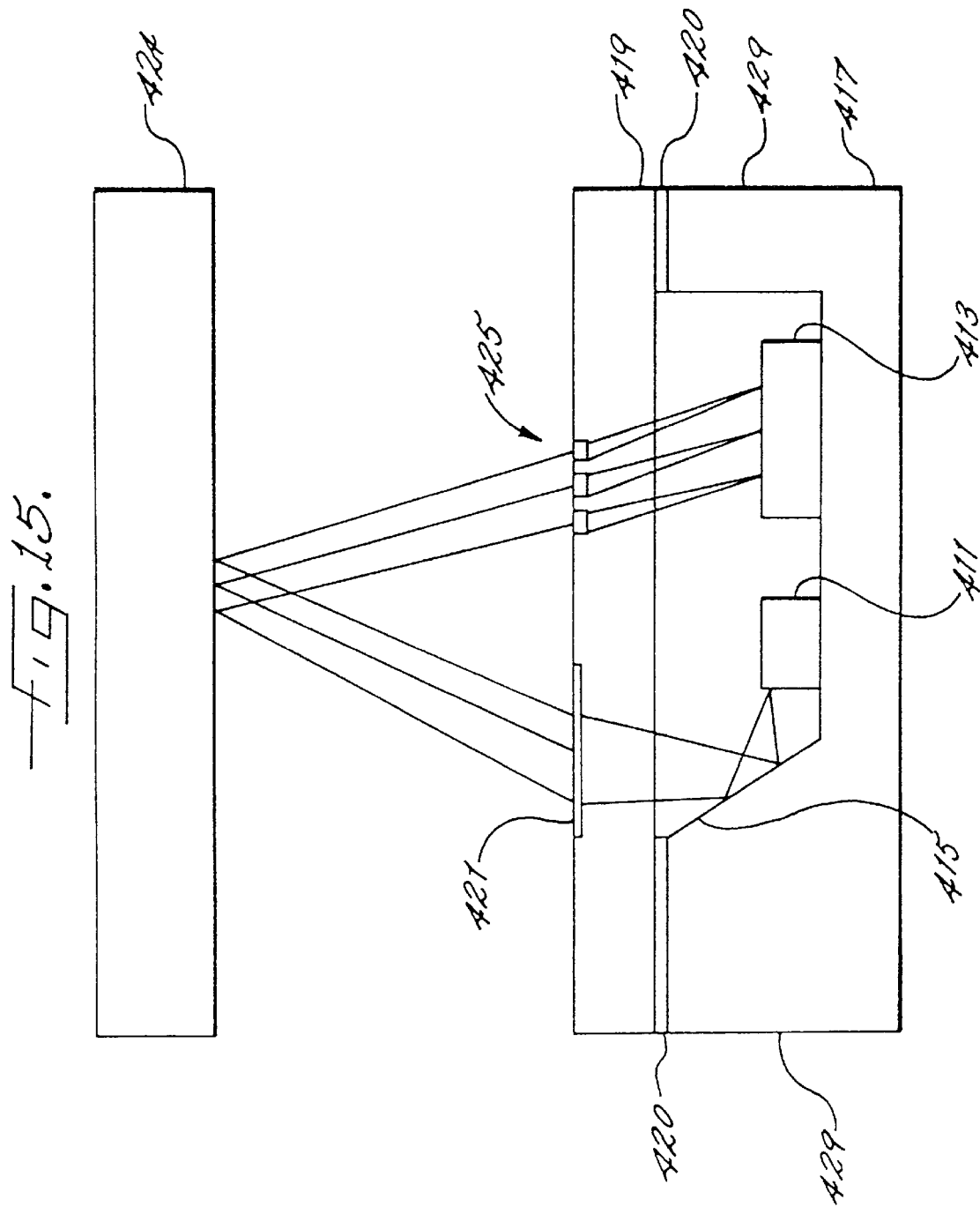
FIG. 15 is a cross sectional view of a third integrated optical head including a transparent substrate, and a light source and an optical detector on a support substrate adjacent the transparent substrate according to the present invention.

The optical head of FIG. 15 is similar to that of FIG. 14 with the exception that the optical elements have been modified. In FIG. 15, the diffractive optical element 421 separates the reflected light into three beams which are transmitted to the media 424 and reflected back toward the transparent substrate 419. A separate diffractive element 425 is then provided on the transparent substrate 419 for each of the reflected beams. Accordingly, each of the diffractive optical elements 425 focuses a respective reflected beam onto a respective detector portion of the optical detector chip 413. As before, the laser chip 411, mirror 415, and optical detector chip 413 are provided on a silicon substrate 417 which is aligned with and attached to the transparent substrate 419 through the attachment areas 429 and solder material 420.

In the structures of FIGS. 13, 14, and 15, the substrates can be passively aligned and attached using patterns formed photolithographically. For example, each of the adjacent substrates can be passively aligned using V-shaped grooves as discussed above with regard to FIG. 11A, photolithographically placed metallization pads as discussed above with reference to FIG. 11B, or a raised bench indexed into a recess as discussed above with regard to FIG. 11C. Furthermore, accurate spacing can be provided using a bench as discussed above with regard to FIG. 11D.

The structures of FIGS. 13, 14, and 15 can be fabricated by first forming a support wafer, such as a silicon wafer, having a plurality of lasers, mirrors, and detectors thereon, and passively aligning and attaching the support wafer to a transparent wafer having a plurality of optical elements formed thereon. A plurality of optical heads can thus be formed simultaneously and then diced apart by cutting both the transparent and support substrates simultaneously. Alternately, the silicon wafer can be diced and individual laser/detector assemblies aligned and attached to the transparent substrate such as by flip-chip attachment. By first forming a support wafer with lasers thereon, the lasers can be tested and burned-in independently.

As discussed above, the recesses can be etched into the support substrate, and the lasers can be provided in respective recesses. More particularly, the recesses can be formed by isotropically etching a silicon substrate along a crystalline plane so that a sidewall of the recess has a 45 degree angle. The sidewall of the recess can thus be used as the mirror. Moreover, the unetched portions of the silicon can be used to provide spacers when bonding the silicon with the transparent wafer or substrate. In addition, while the detector is illustrated as a chip on the silicon substrate, the detector can be formed in the surface of the substrate. For example, a photosensitive diode can be formed in the silicon substrate to provide photodetection.

In the drawings and specification, there have been disclosed illustrated preferred embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed is:

1. An apparatus for use with data storage media and comprising:
   an integrated optical head comprising
      a first transparent substrate being optically transparent and having opposing first and second faces,
      a support substrate adjacent said first face of said first substrate, wherein said support substrate includes a light source and an optical detector, wherein said light source emits light through said first substrate and toward the data storage media, and wherein said optical detector detects light reflected from the data storage media and through said first substrate,
      at least one first optical element on said first transparent substrate and positioned in an optical path between said light source and said optical detector, and
      first passive alignment means for passively aligning said first transparent substrate and at least one of either said light source or said optical detector; and
   head positioning means for positioning said integrated optical head relative to the data storage media.

2. An apparatus according to claim 1 wherein said first passive alignment means comprises:
   a first plurality of contact pads on the first face of said first transparent substrate;
   a second plurality of contact pads on said support substrate; and
   solder material between said first and second plurality of contact pads to passively align said first transparent substrate and at least one of either said light source or said optical detector.

3. An apparatus according to claim 1 wherein said passive alignment means provides a predetermined spacing between said first substrate and at least one of either said light source or said optical detector.

4. An apparatus according to claim 1 wherein said first passive alignment means comprises mechanical mating means between the first face of said first transparent substrate and said support substrate.

5. An apparatus according to claim 4 wherein said mechanical mating means comprises a plurality of features defined between the first face of said first transparent substrate and said support substrate.

6. An apparatus according to claim 1 wherein said at least one first optical element comprises at least one of a diffractive optical element and a refractive optical element; and wherein said at least one first optical element is on at least one of the first face and the second face of said first substrate.

7. An apparatus according to claim 1 wherein said at least one first optical element comprises a hybrid optical element including diffractive and refractive portions.

8. An apparatus according to claim 1 further comprising:
   a second transparent substrate positioned adjacent said second face of said first transparent substrate, said second transparent substrate being optically transparent and having opposing first and second faces; and
   at least one second optical element on said second transparent substrate in the optical path between said light source and said optical detector.

9. An apparatus according to claim 8 wherein said at least one second optical element comprises a hybrid optical element including diffractive and refractive portions.

10. An apparatus according to claim 8 further comprising second passive alignment means for passively aligning said first transparent substrate and said second transparent substrate so that said at least one second optical element is aligned in the optical path between said light source and said optical detector.

11. An apparatus according to claim 10 wherein said second passive alignment means comprises:
   a third plurality of contact pads on the second face of said first transparent substrate;
   a fourth plurality of contact pads on the first face of said second transparent substrate; and
   solder material between said third and fourth plurality of contact pads to passively align said first transparent substrate and said second transparent substrate.

12. An apparatus according to claim 10 wherein said second passive alignment means comprises mechanical mating means between said second face of said first transparent substrate and said first face of said second transparent substrate.

13. An apparatus according to claim 12 wherein said mechanical mating means comprises a plurality of mechanically mating features.

14. An apparatus according to claim 1 wherein said light source comprises an edge emitting light source and further comprising:
   a mirror adjacent said support substrate and in the optical path between said light source and said optical detector.

15. An optical system comprising:
   a first transparent substrate having alignment areas photolithographically placed on a first face and at least one diffractive optical element photolithographically formed in a second face, the photolithography of the first face being aligned with the photolithography of the second face;
   a support substrate having at least one electronic device thereon, wherein said support substrate is mounted to said first face of said first transparent substrate by said alignment areas causing passive optical alignment between said electronic device and said diffractive optical element;
   substrate alignment areas on the second face of said first transparent substrate; and
   a second transparent substrate having mating substrate attachment areas on a first face for attaching said first transparent substrate in alignment with said second transparent substrate.

16. An optical system according to claim 15 wherein said substrate attachment areas further comprises photolithographically placed metalization pads and solder material.

17. An optical system according to claim 15 wherein said first transparent substrate is part of a first wafer and said second transparent substrate is part of a second wafer, said first transparent substrate and said second transparent substrate having been aligned by alignment of fiducial marks on said first wafer with fiducial marks on said second wafer respectively, said wafers having been attached to each other by said attachment areas prior to being diced into separate assemblies.

18. An optical system according to claim 15 further comprising refractive optical elements on a face of said second transparent substrate.

19. An optical system according to claim 15 wherein said system is a media reader and said at least one electronic device further comprises:
   a light source light source; and
   a plurality of light detectors.

20. An optical system according to claim 19 wherein said at least one diffractive optical element which divides the light from said light source into a plurality of beams for reflection from said media, each reflected beam having an individual optical element on the first surface of said second transparent substrate for transmitting said reflected beam to a detector.

21. An optical system according claim 15 further comprising:
   a light source mounted to the first face of said support substrate, wherein said diffractive optical element divides light from said light source into a plurality of beams for refection from a media;
   a detector device having a plurality of light sensitive areas, said detector being mounted to said support substrate by said alignment areas; and
   a plurality of optical elements on the first surface of said second transparent substrate, each reflected beam passing through an individual optical element on the first surface of said second transparent substrate for transmitting said reflected beam to one of said light sensitive areas of said detector.

22. An optical system according claim 15 wherein said passive optical alignment provides a predetermined spacing between said electronic device and said diffractive optical element.

23. An integrated optical system comprising:
   a first transparent substrate having alignment areas photolithographically placed on a first face and at least one hybrid optical element photolithographically formed in a second face, the photolithography of the first face being aligned with the photolithography of the second face; and
   a support substrate having at least one electronic device thereon, wherein said support substrate is mounted to said first face of said first transparent substrate by said alignment areas causing passive optical alignment between said electronic device and said hybrid optical element.

24. An integrated optical system of claim 23 wherein the hybrid optical element formed in the second face of the first transparent substrate further comprises:
   a metal layer defining an aperture; and
   a diffractive optical element located within the aperture for directing light from a light source in the electronic device to a media.

25. An integrated optical head for use with data storage media, said integrated optical head comprising:
   a first transparent substrate being optically transparent and having opposing first and second faces;

a support substrate adjacent said first face of said first transparent substrate, wherein said support substrate includes a light source and an optical detector, wherein said light source emits light through said first transparent substrate and toward the data storage media, and wherein said optical detector detects light reflected from the data storage media and through said first transparent substrate;

at least one first optical element on said first transparent substrate and positioned in an optical path from said light source to said optical detector; and mechanical mating means between said first face of said first transparent substrate and said support substrate for passively aligning said first transparent substrate and at least one of either said light source or said optical detector.

26. An integrated optical head according to claim 25 wherein said mechanical mating means comprises a plurality of mechanically mating features defined between the first surface of said first transparent substrate and said support substrate.

27. An integrated optical head according to claim 25 wherein said at least one first optical element comprises at least one of a diffractive optical element and a refractive optical element.

28. An integrated optical head according to claim 25 wherein said at least one first optical element comprises a hybrid optical element including diffractive and refractive portions.

29. An integrated optical head according to claim 25 further comprising:

a second transparent substrate positioned adjacent the second face of said first transparent substrate, said second transparent substrate being optically transparent and having opposing first and second faces; and at least one second optical element on said second transparent substrate.

30. An integrated optical head according to claim 29 further comprising:

passive alignment means for passively aligning said first transparent substrate and said second transparent substrate so that said at least one second optical element is aligned in the optical path between said light source and said optical detector.

31. An integrated optical head according to claim 29 wherein said at least one second optical element comprises at least one of a diffractive optical element and a refractive optical element.

32. An integrated optical head according to claim 25 wherein said mechanical mating means provides a predetermined spacing between said substrate and at least one of either said light source or said optical detector.

33. An integrated optical head for use with data storage media, said integrated optical head comprising:

a first transparent substrate being optically transparent and having opposing first and second faces;

a first plurality of contact pads on the first face of said first transparent substrate;

a support substrate adjacent said first face of said first transparent substrate, wherein said support substrate includes a light source and an optical detector, wherein said light source emits light through said first transparent substrate and toward the data storage media, and wherein said optical detector detects light reflected from the data storage media and through said first transparent substrate;

a second plurality of contact pads on said support substrate;

at least one first optical element on said first transparent substrate and positioned in an optical path between said light source and said optical detector; and solder material between said first and second plurality of contact pads for passively aligning said first transparent substrate and at least one of either said light source or said optical detector.

34. An integrated optical head according to claim 33 wherein said at least one first optical element comprises at least one of a diffractive optical element and a refractive optical element; and wherein said at least one first optical element is on at least one of the first face and the second face of said first substrate.

35. An integrated optical head according to claim 33 wherein said at least one first optical element comprises a hybrid optical element including diffractive and refractive portions.

36. An integrated optical head according to claim 33 further comprising:

a second transparent substrate positioned adjacent said first substrate said second transparent substrate being optically transparent and having opposing first and second faces; and at least one second optical element on said second transparent substrate.

37. An integrated optical head according to claim 33 wherein said plurality of solder bumps provide a predetermined spacing between said first substrate and at least one of either said light source or said optical detector.

38. An article during the manufacture of a plurality of integrated optical heads, said article comprising:

a first transparent wafer being optically transparent and having opposing first and second faces;

a second transparent wafer being optically transparent adjacent the second face of said first transparent wafer and having opposing first and second faces, and a plurality of optical elements on said second transparent wafer;

a support wafer adjacent the first face of said first transparent wafer wherein said support wafer has a plurality of light sources and optical detectors thereon; and passive alignment means for passively aligning said first transparent wafer and said second transparent wafer so that said plurality of light sources and optical detectors are aligned with said plurality of optical elements.

39. An article according to claim 38 further comprising an adhesive for securing said first and second wafers together.

40. An article according to claim 38 wherein said plurality of optical elements comprises diffractive optical elements.

41. An article according to claim 38 wherein said plurality of optical elements comprises refractive optical elements.

42. An article according to claim 38 wherein said plurality of optical elements comprises hybrid optical elements, each including diffractive and refractive portions.

43. An article according to claim 38 wherein said passive alignment means provides a predetermined spacing between said first wafer and said second wafer.

44. An article according to claim 38 wherein said passive alignment means comprises:

a first plurality of contact pads on the second face of said first wafer;

a second plurality of contact pads on the first face of said second wafer; and solder material between said first and second plurality of contact pads to passively align said first wafer and second wafers.

45. An article according to claim 38 wherein said passive alignment means comprises alignment indicia on said first wafer and said second wafer.

46. An article according to claim 38 wherein said passive alignment means comprises mechanical mating means between said second face of said first wafer and said first face of said second wafer.

47. An article according to claim 46 wherein said mechanical mating means comprises a plurality of mechanically mating features defined in the second surface of said first wafer and the first face of said second wafer.

48. A method for making an integrated optical head for use with data storage media, the method comprising the steps of:
providing a first transparent substrate having opposing first and second faces;
forming at least one first optical element on the first transparent substrate;
providing a support substrate having a light source and an optical detector thereon;
positioning said support substrate adjacent the first face of the first transparent substrate so that the light source emits light through said first transparent substrate and toward the data storage media and so that the optical detector detects light reflected from the data storage media and through said first transparent substrate; and
passively aligning the first transparent substrate and the support substrate.

49. A method according to claim 48 wherein the step of passively aligning comprises the steps of:
forming a first plurality of contact pads on the first face of said first transparent substrate;
forming a second plurality of contact pads on said support substrate; and
forming solder material between said first and second plurality of contact pads to passively align said first transparent substrate and at least one of said light source and said optical detector.

50. A method according to claim 49 wherein the steps of forming the first and second pluralities of contact pads comprises forming same using photolithography.

51. A method according to claim 48 wherein the step of passively aligning comprises the steps of:
forming mechanically mating features between the first surface of said first transparent substrate and said support substrate; and
relatively positioning said first transparent substrate and said support substrate so that said mechanically mating features touch one another.

52. A method according to claim 48 further comprising the steps of:
providing a second transparent substrate comprising at least one second optical element; and
passively aligning the second transparent substrate with the second surface of said first transparent substrate so that the at least one second optical element is positioned in an optical path between said light source and said optical detector.

53. A method according to claim 52 wherein the steps of providing the first and second transparent substrates comprises providing first and second transparent wafers; and wherein the step of passively aligning the first and second transparent substrates comprises passively aligning the first and second transparent wafers.

54. A method according to claim 53 further comprising the steps of securing the aligned first and second transparent wafers together; and dicing the wafers into a plurality of integrated optical devices.

55. A method according to claim 48 wherein said step of passively aligning comprises providing a predetermined spacing between the first substrate and at least one of either said light source or said optical detector.

56. An integrated optical system comprising:
a first transparent substrate having at least one alignment area on a second face;
a second transparent substrate mounted to the second face, the mounting including a mating alignment area on the second transparent substrate for mating with the alignment area and causing passive optical alignment between the first transparent substrate and the second transparent substrate;
a support substrate having a light source and a light detector thereon adjacent a first face of said first transparent substrate;
a holographic optical element formed on one of said transparent substrates for directing light from the light source to a remote target; and
a refractive lens formed on the other of said transparent substrates for directing light from the light source to the remote target.

57. An integrated optical system according to claim 56 wherein said first and second substrates comprise fused silica.

58. An integrated optical system according to claim 56 wherein:
the alignment area further comprises a metalized area of predetermined size and position;
the mating alignment area further comprises a metalized area of predetermined size and position; and
the mounting further comprising solder material of predetermined volume and liquified surface tension for passively pulling the first transparent substrate and the second transparent substrate into horizontal alignment and maintaining the second substrate a predetermined distance from the first transparent substrate.

59. An integrated optical system according to claim 56 wherein:
the alignment area further comprises an alignment bench of predetermined height and position; and
the mounting further comprising adhesive, the bench and the recess interacting to maintain the first transparent substrate and the second transparent substrate in horizontal alignment and to maintaining the second substrate a predetermined distance from the first transparent substrate.

60. An integrated optical system according to claim 56 wherein the light source further comprises a semiconductor light source adjacent to an angled mirror adjacent said support, the light source and the mirror mounted aligned with each other and aligned with the holographic optical element by flip chip solder bonds.

61. An integrated optical system according to claim 56 wherein the holographic optical element formed in the second face of the first transparent substrate further comprises:
a metal layer defining an aperture; and
a diffractive optical element located within the aperture for directing light from the light source to the remote target.

* * * * *

UNITED STATES PATENT AND TRADEMARK OFFICE
CERTIFICATE OF CORRECTION

PATENT NO. : 5,886,971
DATED : March 23, 1999
INVENTOR(S) : Feldman, et al.

It is certified that errors appear in the above-identified patent and that said Letters Patent is hereby corrected as shown below:

Title page, item [56], References Cited
Under Other Publications: Please add the following publication.

Wai-Hon Lee, *Holographic Optical Head for Compact Disk Applications*, Pencom International Corporation, June 1989, Volume 28, No. 6.

In Claim 22, Column 12, Line 39, insert the word --to-- between according and claim.

In Claim 60, Column 16, Line 55, insert the word --and-- between mounted and aligned.

Signed and Sealed this

Thirtieth Day of November, 1999

Attest:

Q. TODD DICKINSON

*Attesting Officer*  *Acting Commissioner of Patents and Trademarks*